United States Patent
Petrofsky

(10) Patent No.: US 6,362,677 B1
(45) Date of Patent: Mar. 26, 2002

(54) APPARATUS AND METHODS FOR PERFORMING RMS-TO-DC CONVERSION UTILIZING CLOCK DITHERING

(75) Inventor: Joseph G. Petrofsky, Cupertino, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/735,331

(22) Filed: Dec. 12, 2000

(51) Int. Cl.[7] .............................................. G06F 7/556
(52) U.S. Cl. ....................................... 327/348; 327/164
(58) Field of Search ................................ 327/102, 164, 327/346, 347, 348, 349

(56) References Cited

U.S. PATENT DOCUMENTS 4,360,880 A * 11/1982 Brodie et al. ................ 324/132
5,896,056 A     4/1999 Glucina ....................... 327/348

OTHER PUBLICATIONS

Joseph V. Alder, "Clock–source Jitter: A Clear understanding aids in oscillator selection," *EDN Magazine*, pp. 79–86, Feb. 18, 1999.

Horowitz and Hill, *The Art of Electronics*, 2nd Edition, sections 9.32–37, pp. 655–664.

Howard Johnson, "Intentional Clock Modulation," *EDN Magazine*, p24, Aug. 3, 1998.

Mochenbacher and Fitchen, *Low Noise Electronic Design*, John Wiley and Sons, Inc., Section 1–9, pp. 19–20, ©1973.

E.J. van der Zwan et al. "A 13mW 500kHz Data Acquisition IC with 4.5 Digit DC and 0.02% Accurate True–RMS Extraction," *IEEE ISSCC99*, session 23, paper WP 23.4, Feb. 1999.

W.S. Wey and Huang, "A CMOS Delta–Sigma True RMS Converter," *IEEE Journal of Solid–State Circuits*, vol. 35, No. 2, pp. 248–257, Feb. 2000.

Part No. NE555, *Texas Intruments Linear Circuits Data Book: 1984 Edition*, pp. 5–21 to 5–30.

Part No. AD8571, *Analog Devices*, pp. 12–13, ©1999.

* cited by examiner

Primary Examiner—Jeffrey Zweizig
(74) Attorney, Agent, or Firm—Fish & Neave; Robert W. Morris

(57) ABSTRACT

The invention provides methods and apparatus for performing RMS-to-DC conversion in which the input signal is sampled using circuitry that includes a clock signal. The clock signal is dithered, however, to account for various problems that may occur, such as aliasing. The dithering may occur during the sampling prior to the conversion, such as when the input signal is converted to a digital signal prior to the conversion. Alternately, the dithering may occur as part of the RMS-to-DC conversion.

30 Claims, 7 Drawing Sheets

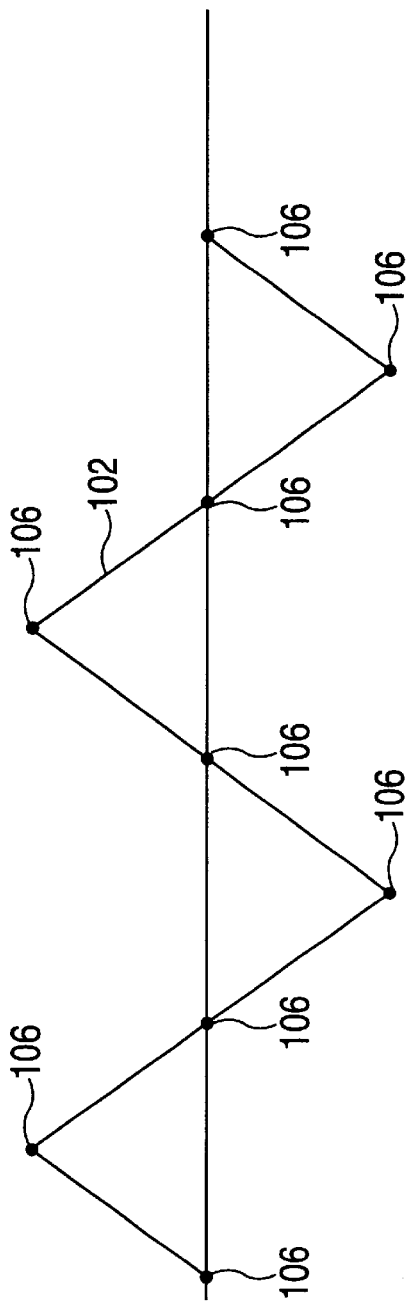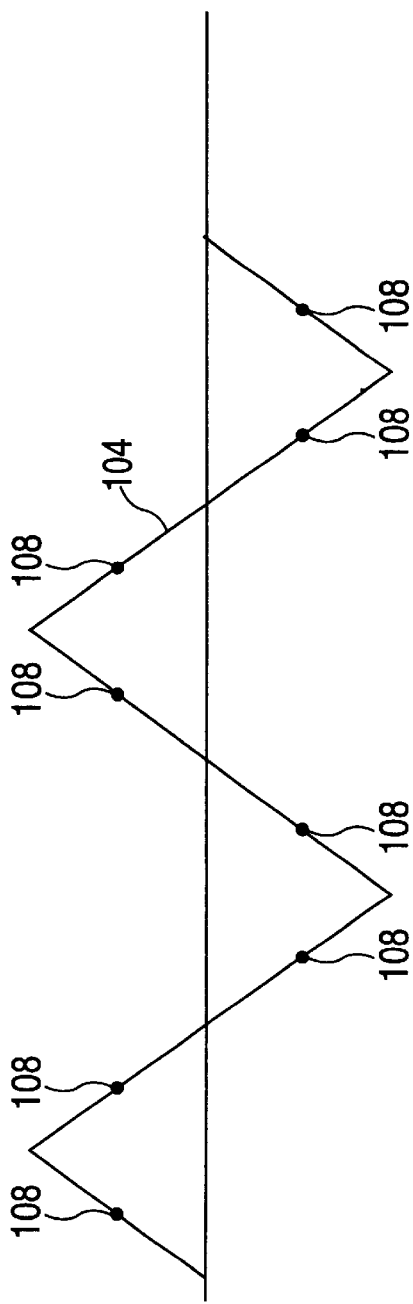

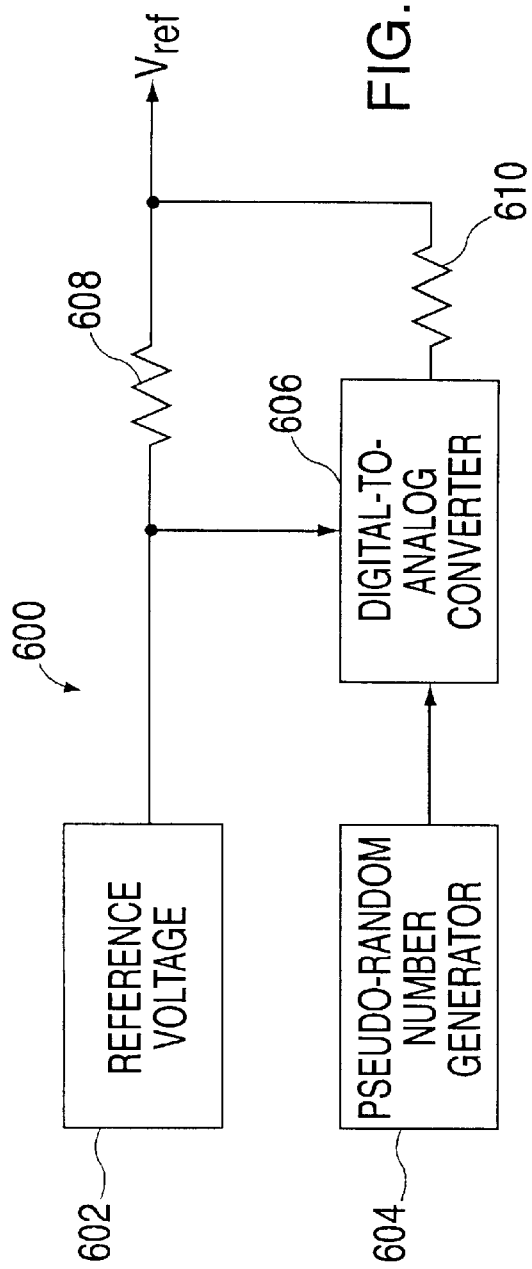
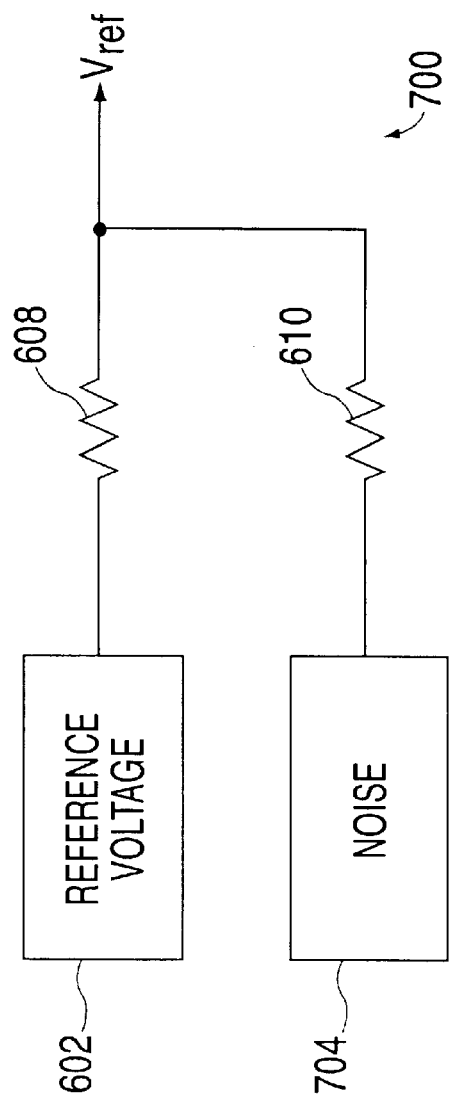

US 6,362,677 B1

APPARATUS AND METHODS FOR PERFORMING RMS-TO-DC CONVERSION UTILIZING CLOCK DITHERING

BACKGROUND OF THE INVENTION

The present invention relates to apparatus and methods for providing an output signal proportional to the root-mean-square (RMS) value of an input signal. More particularly, the present invention relates to apparatus and methods for utilizing clock dithering to sampled data to provide an output signal proportional to the RMS value of an input signal having a bipolar signal range. The output signal may be a direct current (DC) signal proportional to the RMS value of an input signal (commonly called RMS-to-DC conversion), or may be a digital signal that has a value that is proportional to the RMS value of an input signal.

There are various known methods for performing RMS-to-DC conversion. Many of these methods utilize continuous time circuits, such thermal and log/anti-log techniques in performing the conversion. Recently, there has been a trend toward utilizing data sampling in accomplishing the conversion. The data sampling may be used in different ways, such as being used as a front end data converter in which analog signals are sampled and converted to digital signals. Under these circumstances, the RMS-to-DC conversion circuitry is entirely digital (see, e.g., E. J. van der Zwan et al., "A 13 mW 500 kHz Data Acquisition IC with 4.5 Digit DC and 0.02% Accurate True-RMS Extraction," IEEE ISSCC99, session 23, paper WP 23.4 (1999)). Alternately, the sampling circuitry may be incorporated into the conversion circuitry so that the output signal remains analog (see, e.g., W. S. Wey, "A CMOS Delta-Sigma True RMS Converter," IEEE Journal of Solid-State Circuits, vol. 35, no. 2, Feb. 2000, pp. 248–257).

These known data sampler converters typically perform the sampling process at a fixed frequency, which may result in aliasing problems and/or bandwidth limitations. With most input waveforms, there should not be a corruption of the conversion process. However, the conversion process may be corrupted when, for example, there is a frequency component aliased on top of another frequency component. For instance, if a fundamental frequency of Fs/4 waveform also has energy at its third harmonic, the third harmonic will alias from 3*Fs/4 to Fs/4, on top of the fundamental. The result may be constructive or destructive, depending on the exact phase of the sampling.

Attempts have been made to address these problems, often utilizing filter circuits to filter out all frequencies above Fs/2. Such techniques, however, must inherently be frequency selective, with an amplitude response that varies with frequency. This may result in a pass-band having a flatness that directly affects the accuracy of the RMS-to-DC conversion. Moreover, the input signal bandwidth of the RMS-to-DC conversion is necessarily constrained to be less than half of the sampling frequency, which can also cause incorrect results when any significant harmonic energy is filtered out.

Therefore, it would be desirable to provide methods and apparatus for performing RMS-to-DC conversion that utilize data sampling techniques without incurring aliasing problems.

It also would be desirable to provide methods and apparatus for performing RMS-to-DC conversion that utilize data sampling techniques that provide for inherent accuracy versus frequency.

SUMMARY OF THE INVENTION

In accordance with these and other objects of the present invention, RMS-to-DC converter circuits in accordance with this invention include circuitry that dithers the clock signal used during sampling. The dithering circuits take advantage of the fact that the data itself is sampled at a high frequency, while only a low frequency characterization of the data is necessary. For example, the power distribution grid in most countries is either 50 Hz or 60 Hz, which requires an averaging filter that substantially filters all variations of 20 msec duration or less. These filters, for accuracy at line frequency, are typically just 1–5 Hz. On the other hand, a typical RMS-to-DC converter is constructed using a substantially higher sample frequency, such as 100 kHz.

The present invention dithers the sampling clock signal in a random or random-like manner, such that the input frequency and the sample frequency are highly unlikely to ever be identical, or in an error-prone ratio (i.e., with respect to harmonics). Moreover, the spectrum of the sampling clock need not have a wide bandwidth, as has been used in other applications, such as measurement and electrical interference problems. Instead, the dithering need only have enough jitter over the course of the RMS averaging time constant so as to sample any high frequency input in many "random" phases.

One of the advantages of the present invention is that the selection of a specific RMS-to-DC converter circuit is independent of the present invention. All that is required is that the conversion circuit must be a sampled-data system. For example, the system could utilize a sampling digital-to-analog converter (DAC) as a front end to produce digital sampled data. Then, the digital data could be fed as a data stream to a digital processing system that performs the conversion. Alternately, the sampling system can be incorporated into the RMS-to-DC converter and the converter itself could perform the conversion using entirely analog processing resulting in an analog output signal.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which:

FIGS. 1A and 1B are graphs of a triangle waveform used to illustrate potential problems solved by the present invention;

FIG. 6 is a reference voltage circuit constructed in accordance with the present invention;

FIG. 7 is another reference voltage circuit constructed in accordance with the present invention.

DETAILED DESCRIPTION OF THE INVENTION

Figure 2A:
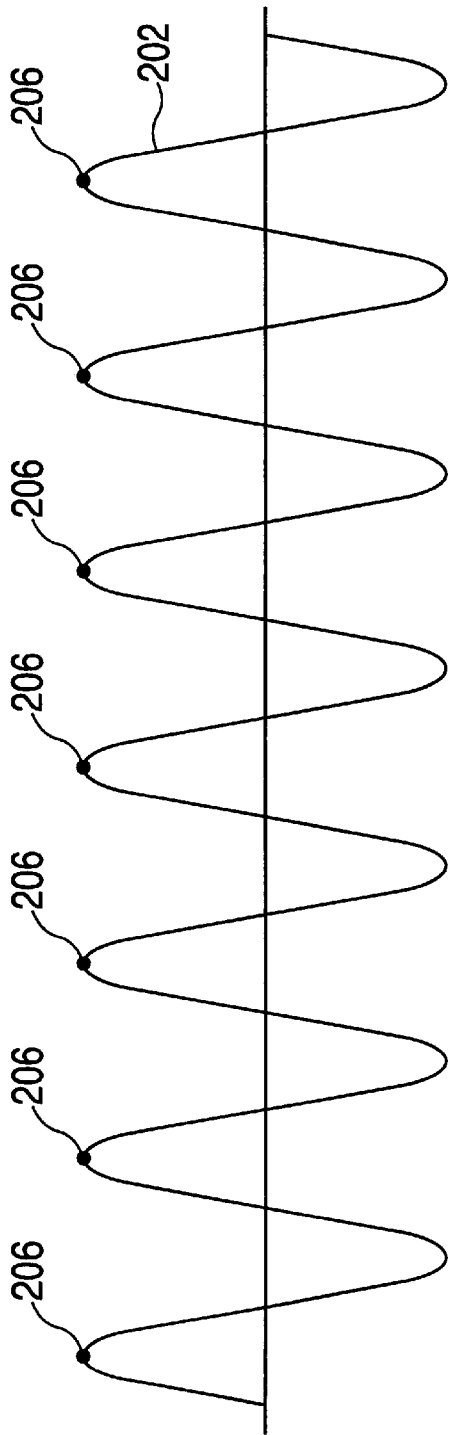
FIGS. 2A and 2B are graphs of a pure sine-wave used to illustrate potential problems solved by the present invention.

FIGS. 1A and 1B illustrate one example of the potential problems that may occur when sampling is used to perform RMS-to-DC conversion. Triangle waveform 102 has a peak value of 1.73205 volts (i.e., the square root of 3), and is a somewhat special case in that it consists entirely of a fundamental and odd harmonics that will all alias on top of each other at Fs/4—the fundamental. As shown in FIG. 1A, sampling occurs at the zero crossings, peaks and valleys, as indicated by dots 106 shown on FIG. 1A. Those sample points would present the RMS-to-DC conversion circuitry with a string of inputs roughly equal to: 0, 1.73205, 0, −1.73205, 0, 1.73205, 0, −1.73205, etc. The conversion circuitry would then produce a DC result of 1.2247 volts, which is a roughly 22.5% over-estimation of the actual value.

FIG. 1B, on the other hand, illustrates the effect of a simple phase shift on the sampled information. Triangle waveform 104 is substantially identical to triangle waveform 102, however, in this case, it has been phase shifted approximately 45 degrees. The phase-shifted sampling produces a data stream of: +0.866, +0.866, −0.866, −0.866, +0.866, +0.866, etc., as shown by dots 108 on FIG. 1B. In this instance, the conversion circuitry would then produce a DC result of 0.866 volts, which is a roughly 13.5% under-estimation of the actual value.

Figure 2B:
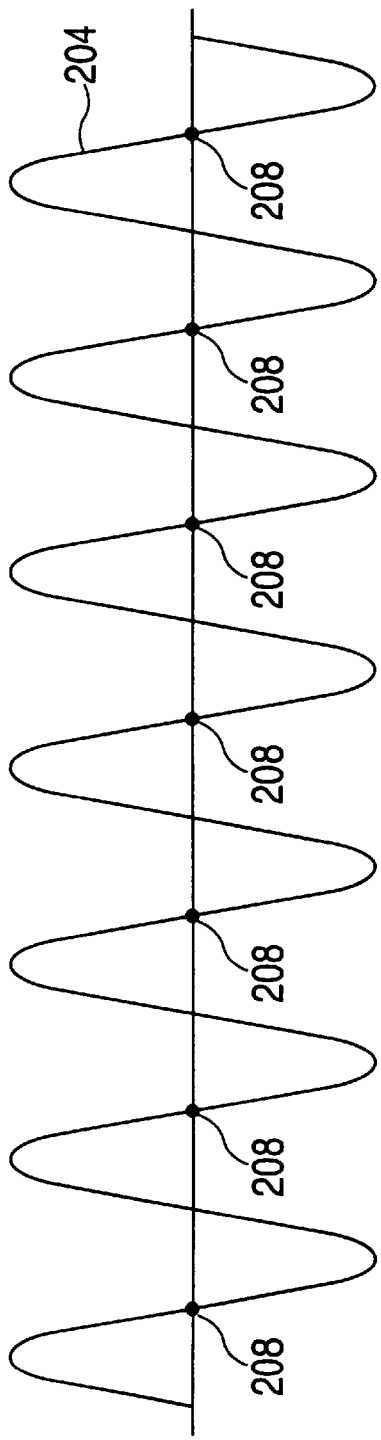

This problem is not limited to a particular waveform. For example, FIGS. 2A and 2B show that similar problems occur even if a pure sine waveform is used. FIG. 2A shows sine waveform 202 in which the sampling rate and the sine waveform are the same frequency (or are integer multiples of one another). Sampling of waveform 202 was taken on data points 206, which coincide with the peak of each sine wave. This would result in a constant value of 1.414 volts being applied to the conversion circuitry, which produces a DC result of 1.414 volts, an over-estimation of approximately 41% over the true RMS value of 1 volt.

FIG. 2B illustrates the same sine waveform and the same sampling frequency, but includes a phase shift. Sampling of waveform 204 was taken using data points 208, which coincide with the zero crossing of each sine wave. This sampling, however, produces a DC result of 0 volts, which obviously is an under estimation.

The variations in RMS-to-DC conversion values based on phase shift, however, can be used advantageously to produce more accurate conversion values in accordance with the principles of the present invention. These advantages are particularly applicable to RMS-to-DC conversions due to the inherent use of 50 Hz or 60 HZ power signals. Since the sampling rate is typically on the order of 100 kHz—persons skilled in the art will appreciate that this value is merely an example and in no way suggests a limitation on the use of the present invention—numerous samples can be taken at various phase-shifted points, and averaged together to produce significantly more accurate RMS-to-DC conversion values irrespective of the relationship between the frequency of the input signal and the sampling frequency. The phase-shifting automatically occurs, in accordance with the principles of the present invention, by dithering the clock signal utilized by the sampling circuitry.

Figure 3:
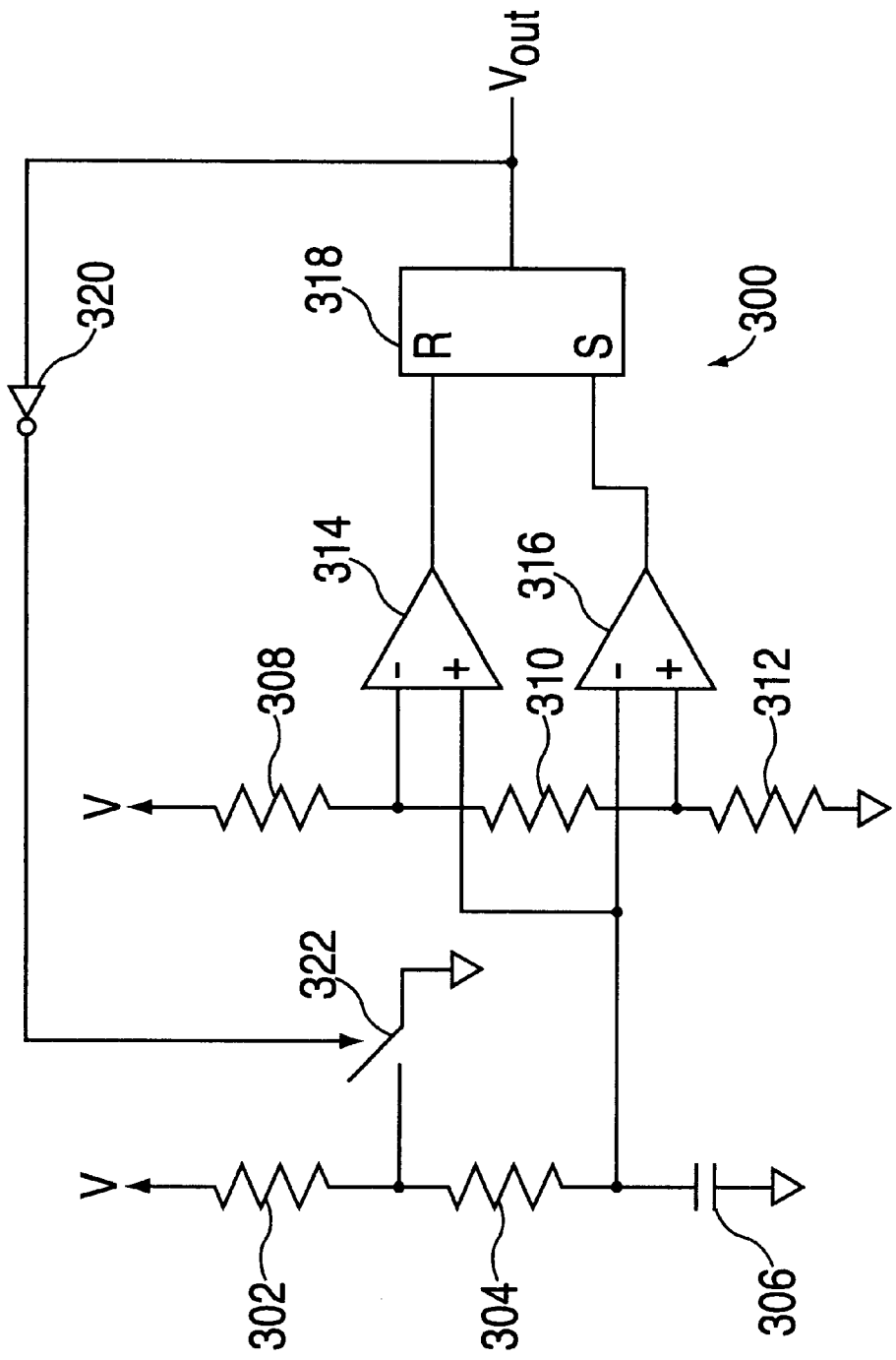
FIG. 3 is a clock generation circuit constructed in accordance with the principles of the present invention.

FIG. 3 is a schematic diagram of clock generation circuitry that may be used in accordance with the principles of the present invention. Clock generation circuit 300 illustrates an R-C timer configured as a free-running oscillator. Circuit 300 includes timing resistors 302 and 304, capacitor 306, voltage setting resistors 308, 310 and 312, comparators 314 and 316, logic gate 318 (in this configuration, an RS flip flop), inverter 320 and switch 322. Resistors 308, 310 and 312 may be configured such that the inverted voltage on comparator 314 is approximately $\frac{2}{3}$ V, while the non-inverted input to comparator 316 is $\frac{1}{3}$ V, by setting each of the three resistors to the same value.

Circuit 300 operates as follows. Voltage through timing resistors 302 and 304 charges capacitor 306 towards the two-thirds supply voltage V on the inverting input of comparator 314 when $V_{OUT}$ is HIGH and switch 322 is OPEN. Once the voltage on capacitor 306 reaches $\frac{2}{3}$ V, the output of comparator 314 resets the latch of logic gate 318, thereby changing $V_{OUT}$ to be LOW and causing switch 322 to close (because the LOW output is inverted by inverter 320). At that point, timing resistor 304 discharges the voltage from capacitor 306 until it reaches the $\frac{1}{3}$ V value on the non-inverting input of comparator 316. Once the voltage on capacitor 306 reaches $\frac{1}{3}$ V, comparator 316 sets logic gate 318, thereby changing $V_{OUT}$ to HIGH and opening switch 322.

Clock dithering maybe introduced into circuit 300, in accordance with the principles of the present invention, in several different ways. One way to create clock dithering in circuit 300 is to set resistors 302 and 304 at very high values (which, necessarily requires that capacitor 306 have a very small value). This exaggerates their affect on the threshold values that cause $V_{OUT}$ to switch from HIGH to LOW and vice-versa because of the increase in Johnson noise that occurs as resistance increases. A further advantage of this approach is that the low value of capacitor 306 may permit it to be included in the same integrated circuit as the oscillator and RMS-to-DC converter (instead of being an external component). However, larger values of resistors 302 and 304 require additional die space, which necessarily limits their size.

Another way to introduce noise into circuit 300 (which results in random or pseudo-random clock dithering) is to operate the comparator input stages at very low current levels—which provides the additional advantage of reduced power consumption. This technique, however, is limited by how slow a response time can be tolerated by the oscillator without failure. An additional method of clock dithering is to add noise directly into the comparator thresholds. Circuit 300, however, is limited in that the comparator thresholds are interconnected, such that any noise introduced into one is introduced into the other. This results in only varying the common mode level of the discharging operating voltage (i.e., resistor 304/capacitor 306).

Figure 4:
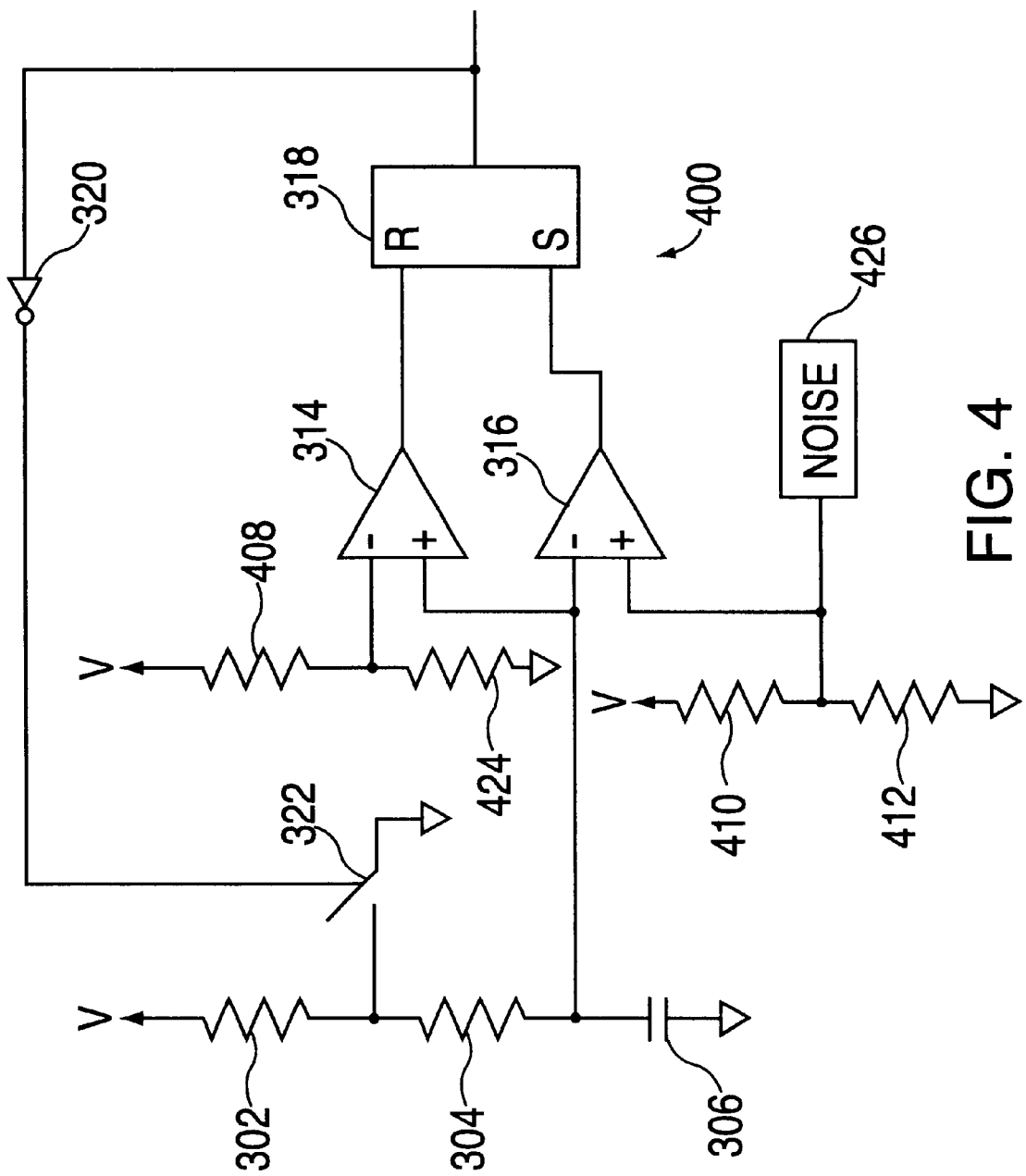
FIG. 4 is another clock generation circuit constructed in accordance with the principles of the present invention.

These deficiencies came be overcome by making slight alterations to circuit 300, as shown in FIG. 4. FIG. 4 shows clock generation circuit 400, which includes numerous components previously described with respect to FIG. 3 (and thus, the previous description applies equally to circuit 400). The configuration of circuit 400 is substantially similar to that of circuit 300, except that the threshold input voltages to the comparators have been isolated from each other. For example, the inverted input to comparator 314 is now set by resistors 408 and 424. Resistor 408 has substantially the same value as resistor 308, while resistor 424 is twice that value so that the voltage is still $\frac{2}{3}$ V. Similarly, resistors 410 and 412 have substantially the same value as resistors 310 and 312 (which are equal to each other), so that the voltage at the non-inverting input to comparator 316 is still $\frac{1}{3}$ V.

Isolating the two threshold inputs, however, enables analog noise generator 426 to be included on one, but not the other threshold (persons skilled in the art will appreciate that either one threshold, the other threshold, or both thresholds—where each threshold is provided with different noise—may be supplemented with noise to cause clock dithering in accordance with the present invention). Noise generation circuitry 426 may be an analog circuit, or it may be a digital pseudo-random noise generator (PRNG) that provides a digital output to a digital-to-analog converter (DAC) prior to being input to the comparator. Circuit 400, however, may not perform at the desired level due to its dependance on the power supply voltage. This adverse dependance may be particularly applicable in the present situation where the input signal is likely to be amplified or otherwise affected by circuits powered from the same power supply. With inadequate de-coupling, the supply voltage may act to phase lock, or injection lock the oscillator to the input signal or a harmonic of the input signal. If that should occur, the benefits of clock dithering would essentially be lost.

Figure 5:
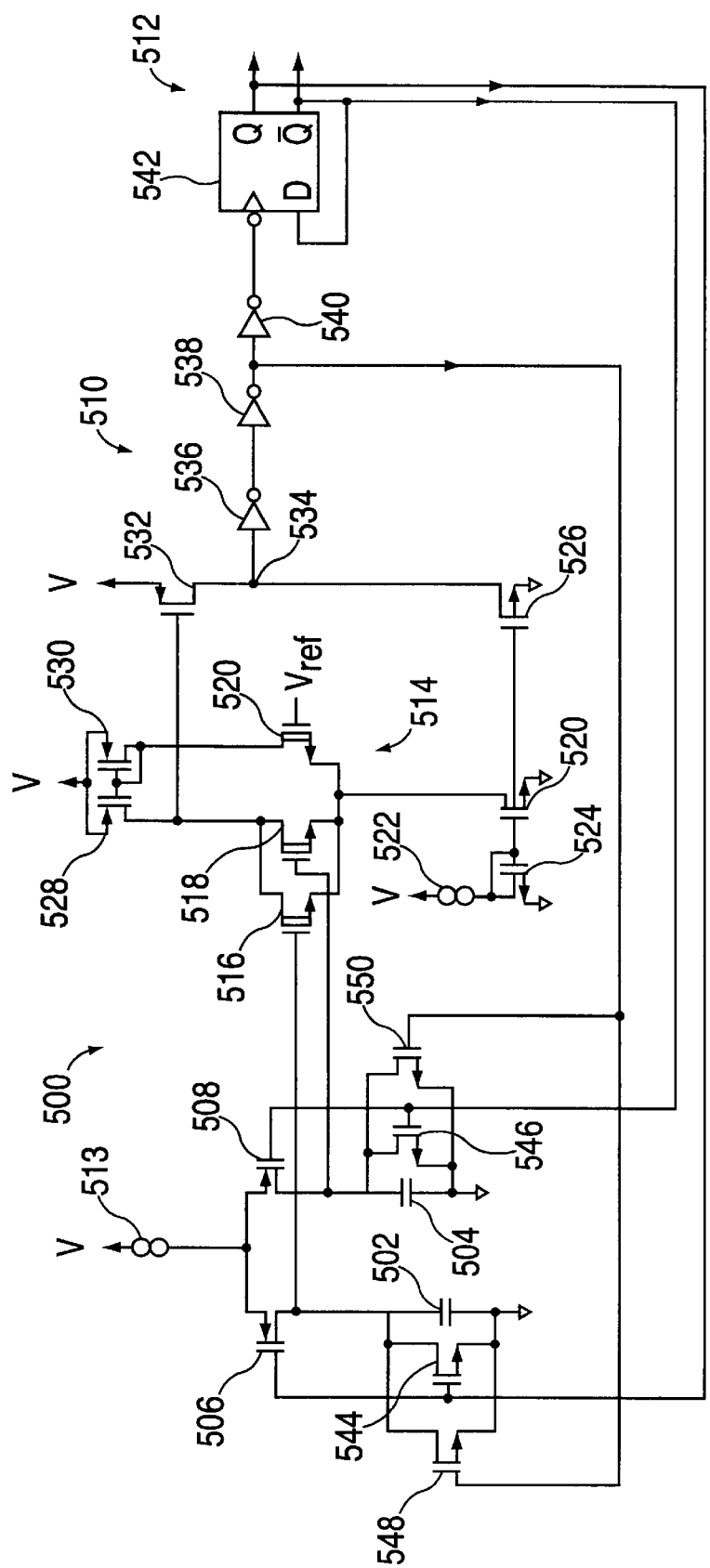
FIG. 5 is another clock generation circuit constructed in accordance with the principles of the present invention.

FIG. 5 shows clock generation circuit 500, which addresses the decoupling problem of the previous circuits. Circuit 500 includes two timing capacitors 502 and 504, charging circuits 506 and 508, logic circuitry 510, and feedback circuitry 512, which all work together to provide a clock signal that is decoupled from the supply voltage, but that is dithered in accordance with the present invention. Circuit 500 may be implemented on a single CMOS integrated circuit, as will be apparent from the discussion below.

Capacitors 502 and 504 are charged by current from current source 513 through transistors 506 and 508, respectively. The use of two capacitors, instead of one, permits the use of different capacitor values and thus an asymmetric duty cycle (where one capacitor contributes a longer clock period to the operation of circuit 500 than the other). Another advantage of the dual-capacitor configuration, is that the oscillator cycle time becomes insensitive to capacitor discharge time, which is poorly controlled. Control of charging circuits 506 and 508 is based on the inputs from feedback circuitry 512, which provides the outputs Q and $\overline{Q}$ to the gates of transistors 506 and 508.

Logic circuitry 510 includes comparator 514, which is formed by transistors 516, 518 and 520. In another aspect of the present invention, the transistors of comparator 514 are all native NMOS transistors, which have a lower $V_{GS}$ threshold to further improve the performance of circuit 500 on very low supply voltages. Additionally, the use of MOS transistors instead of bipolar transistors results in clock dithering occurring due to the 1/f noise that necessarily occurs due to the oxide-semiconductor interface (for an explanation of this phenomenon, see, for example, C. D. Motchenacher et al. "Low-Noise Electronic Design,", Wiley & Sons, pp. 19–20, 1973).

Comparator 514 is biased by transistor 520, which conducts a static bias current provided by current source 522 through the current mirror formed by transistors 520 and 524. Transistor 526 may also conduct the same bias current, at a maximum, but in most instances, will be linearized and conducting no current. Comparator 514 compares the voltage provided by capacitors 502 and 504 (which are provided to the gate of transistors 516 and 518, respectively), to the voltage $V_{REF}$, which is provided to the gate of transistor 520. When the capacitor voltage surpasses $V_{REF}$, the drain of transistor 528 is pulled down, which occurs with little resistance because the drain current from transistor 520 to transistor 530 is reduced. This causes transistor 532 to conduct and provide a logic HIGH at node 534.

In accordance with another principle of the present invention, the logic HIGH is presented to a string of inverters 536, 538 and 540, which are configured in increasing strength. For example, inverter 536 is the weakest inverter and inverter 540 is the strongest. This further reduces the power consumption of circuit 500 as a result of the slow fall of drain current through transistor 528 and the faster, albeit still slowly, rise in the drain of transistor 520. The input to inverter 536 may in fact spend a relatively lengthy time in the cross-conduction zone. Therefore, using a weak inverter as inverter 536 will minimize the amount of current that is cross conducted from the power supply rail to ground.

Since a weak inverter can only drive a light load, a pair of increasing stronger inverters 538 and 540 are used so that the signal is eventually strong enough to drive the input to logic gate 542 (in this case, a D flip-flop). Persons skilled in the art will appreciate that the varying strength of the inverters may be accomplished in integrated circuit fabrication by varying the width-to-length ratio of the MOSFETs used to construct the inverter gates.

Logic gate 542 is configured as a toggle flip-flop so that every time the clock is triggered, the outputs toggle (i.e., change from one state to the other). The outputs Q and $\overline{Q}$ are fed back to transistors 544 and 546, respectively, to alternate the firing sequence of capacitors 502 and 504. The output of inverter 538 is also fed back to the gate of transistors 548 and 550 to ensure proper start-up of circuit 500 (because logic gate 542 is edge-triggered, hang-up states may exist upon startup without an alternate means of discharging timing capacitors 502 and 504—this feedback circuit prevents these problems from occurring).

While some clock dithering may result from the use of MOS transistors for transistors 516, 518 and 520, additional dithering may be provided by operating circuit 500 at very low power levels or by varying the reference voltage $V_{REF}$ provided to the gate of transistor 520. Moreover, it may be preferable to utilize a reference voltage that is insensitive to supply voltage and/or temperature variations by using, for example, a band-gap voltage reference.

FIG. 6 shows one such band-gap voltage reference and circuitry for introducing noise into the reference voltage for the purpose of dithering the clock signal in accordance with the present invention. Circuit 600 includes a band-gap reference voltage source 602, a pseudo-random number generator 604 (PRNG 604), a digital-to-analog converter 606 (DAC 606) and resistors 608 and 610 (with resistor 608 being preferably substantially smaller than resistor 610). PRNG 604, which is well known in the art, may be implemented using any one of many well known techniques.

DAC 606 takes the digital signal from PRNG 604, converts it to analog and combines it with the analog signal from source 602 to produce an analog noise output signal. The difference in the resistor values prevents the noise signal from overwhelming the actual reference voltage signal. FIG. 7 shows a similar configuration in circuit 700 in which the digital implementation of PRNG 604 and DAC 606 is replaced by analog noise generator 704.

Figure 8:
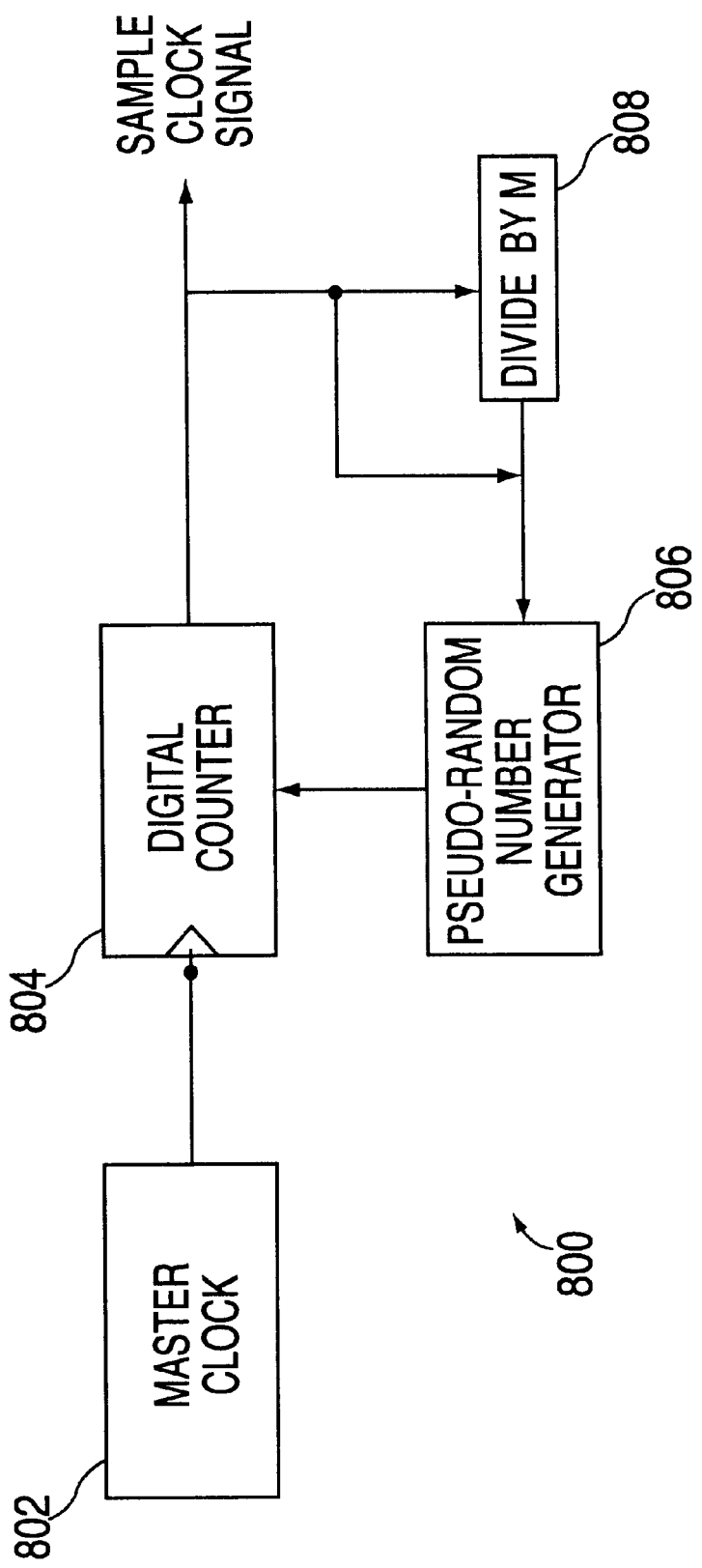
FIG. 8 is a digital clock circuit constructed in accordance with the present invention.

FIG. 8 illustrates one way in which the present invention may be used as part of a large digital signal processing system in circuit 800. Circuit 800 includes digital counter 804, PRNG 806 and may also include divisor 808. Circuit 800 relies on the existence of a master clock signal 802, which, to provide dithering in accordance with the present invention, is divided by N or N+1 in digital counter 804 to provide the dithered sample clock signal (digital counter 804 may be any commercially available digital divider/counter that performs the desired function or any other such circuitry). PRNG 806 is then used every sample clock period to vary the master clock division in a pseudo-random manner. The sample clock signal may be fed directly to PRNG 806, or it may be incremented at a much lower frequency by including a divide-by-M counter 808 between the sample clock signal and PRNG 806 (in which case, the direct connection to PRNG 806 would not exist).

Persons skilled in the art will recognize that the apparatus of the present invention may be implemented using circuit configurations other than those shown and discussed above. All such modifications are within the scope of the present invention, which is limited only by the claims that follow.

I claim:

1. RMS-to-DC circuitry that generates an output signal at an output node proportional to a root-mean-square (RMS) value of an input signal at an input node, the circuit comprising:
    input circuitry that samples an input signal based, at least in part, on a clock signal;
    clock dithering circuitry that dithers said clock signal; and
    conversion circuitry that converts said sampled input signal to said output signal that is proportional to an RMS value of said input signal.

2. The RMS-to-DC circuitry of claim 1, wherein said input circuitry comprises sampling circuitry.

3. The RMS-to-DC circuitry of claim 2, wherein said input circuitry and said conversion circuitry are formed on a single integrated circuit.

4. The RMS-to-DC circuitry of claim 1, wherein said input circuitry comprises a sample-and-hold circuit.

5. The RMS-to-DC circuitry of claim 1, wherein said input circuitry samples an analog signal and produces a digital signal and said conversion circuitry performs a digital conversion of said sampled input signal to said output signal.

6. The RMS-to-DC circuitry of claim 1, wherein said input circuitry samples an analog signal and produces an analog signal and said conversion circuitry performs an analog conversion of said sampled input signal to said output signal such that said output signal is an analog DC output signal.

7. The RMS-to-DC circuitry of claim 1, wherein said input circuitry and said clock dithering circuitry operate prior to said conversion circuitry.

8. The RMS-to-DC circuitry of claim 1, wherein said clock dithering circuitry is operated in conjunction with said conversion circuitry such that said clock dithering is a part of said conversion.

9. The RMS-to-DC circuitry of claim 1, wherein said clock dithering circuitry comprises:
    clock generation circuitry; and
    noise generation circuitry coupled to said clock generation circuitry that introduces noise into said clock generation circuitry and causes changes in timing of said clock generation circuitry.

10. The RMS-to-DC circuitry of claim 9, wherein said clock generation circuitry comprises an R-C oscillator circuit that includes first and second comparators coupled to a logic gate, said logic gate providing said clock signal, said first and second comparators comparing a varying input signal to, respectively, first and second threshold values.

11. The RMS-to-DC circuitry of claim 10, wherein said noise generation circuitry is coupled to only one of said first and second threshold signals.

12. The RMS-to-DC circuitry of claim 1, wherein said clock dithering circuitry comprises:
    first and second timing capacitors;
    first and second charging circuits that respectively charge said first and second timing capacitors;
    logic circuitry having at least one output node that provides said clock signal and an input node;
    feedback circuitry coupled between said output node and at least one of said first and second charging circuits;
    comparator circuitry coupled to said first and second capacitors, said comparator circuitry providing a logic input signal to said logic circuitry in response to a comparison of voltage on said first and second timing capacitors to a reference voltage.

13. The RMS-to-DC circuitry of claim 12, wherein said at least one output node comprises first and second output nodes which provide, respectively, a non-inverted clock signal and an inverted clock signal.

14. The RMS-to-DC circuitry of claim 12, wherein said first and second timing capacitors have different values such that said clock signal is an asymmetric clock signal.

15. The RMS-to-DC circuitry of claim 12, wherein said clock dithering circuitry is formed on a single CMOS integrated circuit.

16. The RMS-to-DC circuitry of claim 15, wherein said comparator circuit is formed from first, second, and third NMOS transistors.

17. The RMS-to-DC circuitry of claim 12, further comprising:
    first, second and third inverters, coupled together in series between said comparator circuitry and said input node of said logic circuitry such that said first inverter is coupled to said comparator circuitry and said third inverter is coupled to said input node, said first inverter being weaker than said second inverter, and said second inverter being weaker than said third inverter.

18. The RMS-to-DC circuitry of claim 12, further comprising:
    voltage reference circuitry that provides said reference voltage, said reference circuitry operating to provide said reference voltage such that said reference voltage is insensitive to supply voltage variations.

19. The RMS-to-DC circuitry of claim 18, wherein said reference circuitry comprises a band-gap voltage reference circuit that operates to provide said reference voltage that is temperature insensitive.

20. The RMS-to-DC circuitry of claim 12, wherein said clock dithering circuitry further comprises:
    noise generation circuitry that adds noise to said reference voltage, said noise causing said clock signal to dither.

21. The RMS-to-DC circuitry of claim 20, wherein said noise generation circuitry provides digital inputs to a digital-to-analog converter that outputs a noise voltage signal that is combined with said reference voltage.

22. The RMS-to-DC circuitry of claim 21, wherein said digital inputs are produced by a pseudo-random number generator.

23. The RMS-to-DC circuitry of claim 22, wherein a master clock signal is provided to said RMS-to-DC circuitry, and wherein said noise generation circuitry further comprises:
    clock division circuitry that divides said master clock signal in a pseudo-random manner, said pseudo-random number generator providing an input signal to said division circuitry every sample clock period.

24. The RMS-to-DC circuitry of claim 20, wherein said noise generation circuitry provides an analog signal that is combined with said reference voltage.

25. A method for performing RMS-to-DC conversion that produces an output signal proportional to a root-mean-square (RMS) value of an input signal at an input node, comprising:
    sampling said input signal based, at least in part, on a clock signal;

dithering said clock signal each sample clock period; and converting said sampled input signal to produce an output signal that is proportional to an RMS value of said input signal.

26. The method of claim 25, wherein said sampling produces an analog sampled signal, and said converting operates to produce said output signal, said output signal being an analog output signal.

27. The method of claim 25, wherein said sampling produces a digital sampled signal, and said converting performs a digital conversion such that said output signal is a digital signal.

28. The method of claim 25, further comprising:
generating said clock signal, said generated clock signal being dithered by said dithering.

29. The method of claim 26, wherein dithering comprises:
introducing an analog noise signal to a reference voltage utilized in generating said clock signal.

30. The method of claim 26, wherein dithering comprises:
producing a pseudo-random digital signal that is converted to an analog signal that is introduced into a reference voltage utilized in generating said clock signal.

* * * * *

UNITED STATES PATENT AND TRADEMARK OFFICE
CERTIFICATE OF CORRECTION

PATENT NO.      : 6,362,677 B1                                                      Page 1 of 1
DATED           : March 26, 2002
INVENTOR(S)     : Joseph G. Petrofsky It is certified that error appears in the above-identified patent and that said Letters Patent is hereby corrected as shown below:

Title page,
Item [56], References Cited, OTHER PUBLICATIONS, change "aids in" to -- aids --.
Change "$2^{nd}$ Edition ," to -- $2^{nd}$ Edition, --.
Change "p24" to -- p. 24 --.
Change "Zwan et al." to -- Zwan et al., --.

Column 1,
Line 18, change "such thermal" to -- such as thermal --.
Line 25, change "E. J." to -- E.J. --.
Line 28, change "IEEE ISSCC99" to -- *IEEE ISSCC99* --.
Line 31, change "W. S." to -- W.S. --.

Column 2,
Lines 25-26, change "digital-to-analog converter (DAC)" to -- analog-to-digital converter (ADC) --.

Column 4,
Line 47, change "came" to -- can --.

Column 5,
Lines 47-48, change "C. D. Motchenacher et al." to -- C.D. Motchenacher et al., --.
Line 48, change "Design,"," to -- Design," --.

Column 6,
Line 46, change "well known" to -- well-known --.

Signed and Sealed this

Fifth Day of November, 2002

Attest:

Attesting Officer

JAMES E. ROGAN
*Director of the United States Patent and Trademark Office*